(12) United States Patent
Ushikura et al.

(10) Patent No.: US 10,347,770 B2
(45) Date of Patent: Jul. 9, 2019

(54) SEMICONDUCTOR DEVICE AND METHOD OF PRODUCING THE SAME

(71) Applicant: JOLED Inc., Tokyo (JP)

(72) Inventors: Shinichi Ushikura, Tokyo (JP); Ayumu Sato, Tokyo (JP)

(73) Assignee: JOLED INC., Tokyo (JP)

(*) Notice: Subject to any disclaimer, the term of this patent is extended or adjusted under 35 U.S.C. 154(b) by 0 days.

(21) Appl. No.: 15/459,658

(22) Filed: Mar. 15, 2017

(65) Prior Publication Data

US 2017/0271518 A1    Sep. 21, 2017

(30) Foreign Application Priority Data

Mar. 16, 2016    (JP) .................. 2016-052814

(51) Int. Cl.
*H01L 29/78*    (2006.01)
*H01L 29/786*   (2006.01)
(Continued)

(52) U.S. Cl.
CPC .... *H01L 29/7869* (2013.01); *H01L 21/02123* (2013.01); *H01L 21/02271* (2013.01);
(Continued)

(58) Field of Classification Search
CPC ........... H01L 29/7869; H01L 29/78609; H01L 29/513; H01L 29/517
See application file for complete search history.

(56) References Cited

U.S. PATENT DOCUMENTS 6,207,486 B1 * 3/2001 Nishiyama ........ H01L 21/28568
                                                                257/E21.168
2012/0161125 A1    6/2012 Yamazaki
(Continued)

FOREIGN PATENT DOCUMENTS

JP    2009-135380 A    6/2009
JP    2012-151460 A    8/2012
(Continued)

OTHER PUBLICATIONS

John G. J. Chern et al., "A New Method to Determine MOSFET Channel Length", IEEE Electron Device Letters, Sep. 1980, pp. 170-173, vol. EDL-1, No. 9, IEEE.
(Continued)

*Primary Examiner* — Trang Q Tran
(74) *Attorney, Agent, or Firm* — Hauptman Ham, LLP

(57) ABSTRACT

According to one embodiment, a semiconductor device includes an insulating substrate, an oxide semiconductor layer, a gate insulating film, a gate electrode, a first insulating film and a second insulating film. The oxide semiconductor layer is provided on the insulating substrate and includes first and second low-resistance regions and a high-resistance region between the first and second low-resistance regions. The gate insulating film is provided on the high-resistance region of the oxide semiconductor layer. The gate electrode is provided on the gate insulating film. The first insulating film is provided above the gate electrode, gate insulating film and first and second low-resistance regions of the oxide semiconductor layer, and contains at least fluorine. The second insulating film is provided on the first insulating film, and contains aluminum.

14 Claims, 5 Drawing Sheets

(51) Int. Cl.
  *H01L 29/51* (2006.01)
  *H01L 21/02* (2006.01)
  *H01L 23/31* (2006.01)

(52) U.S. Cl.
  CPC ........ *H01L 23/3171* (2013.01); *H01L 29/513* (2013.01); *H01L 29/517* (2013.01); *H01L 29/78609* (2013.01); H01L 21/0214 (2013.01); H01L 21/0217 (2013.01); H01L 21/02164 (2013.01)

(56) References Cited

U.S. PATENT DOCUMENTS

| | | |
|---|---|---|
| 2013/0119377 A1 | 5/2013 | Noda et al. |
| 2015/0017761 A1 | 1/2015 | Ando |
| 2015/0053970 A1 | 2/2015 | Lee et al. |
| 2015/0255612 A1* | 9/2015 | Yamazaki ........... H01L 29/7869 257/43 |
| 2016/0380107 A1 | 12/2016 | Yamazaki |

FOREIGN PATENT DOCUMENTS

| | | |
|---|---|---|
| JP | 2013-105763 A | 5/2013 |
| JP | 2013-115097 A | 6/2013 |
| JP | 2015-18889 A | 1/2015 |
| JP | 2015-65426 A | 4/2015 |
| JP | 2017-28288 A | 2/2017 |

OTHER PUBLICATIONS

Jingxin Jiang et al., "Self-Aligned Bottom-Gate In—Ga—Zn—O Thin-Film Transistor With Source/Drain Regions Formed by Direct Deposition of Fluorinated Silicon Nitride", IEEE Electron Device Letters, Jul. 30, 2014, pp. 933-935, vol. 35, No. 9, IEEE.

Office Action in JP Application No. 2016-052814, dated May 7, 2019. 9pp.

* cited by examiner

SEMICONDUCTOR DEVICE AND METHOD OF PRODUCING THE SAME

CROSS-REFERENCE TO RELATED APPLICATIONS

This application is based upon and claims the benefit of priority from Japanese Patent Application No. 2016-052814, filed Mar. 16, 2016, the entire contents of which are incorporated herein by reference.

FIELD

Embodiments described herein relate generally to a semiconductor device applied to, for example, a display unit and a method of manufacturing the semiconductor device.

BACKGROUND

Thin-film transistors (to be referred to as TFTs hereinafter) are used to drive the pixels of, for example, an organic electroluminescent (EL) display unit. There are, for example, top-gate TFTs and bottom-gate TFTs as the TFTs.

The top-gate TFTs include, for example, an oxide semiconductor region called a transparent oxide semiconductor (TOS), a gate electrode formed above the TOS and an interlayer insulating film which covers these. In the TOS, source/drain regions and a channel region are formed so as to be self-aligned with respect to the gate electrode.

DETAILED DESCRIPTION

Figure 1:
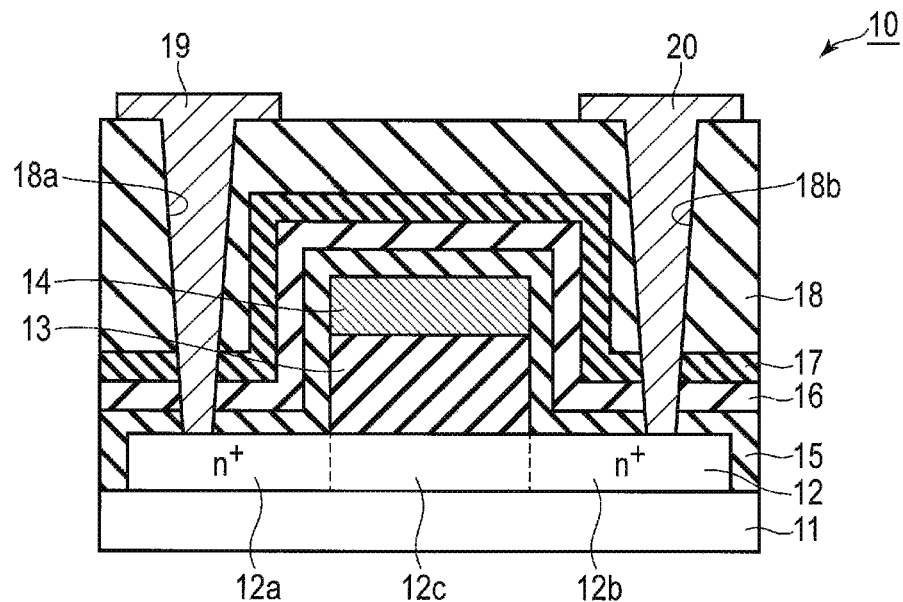
FIG. 1 is a cross section of a semiconductor device according to the first embodiment.

In general, according to one embodiment, a semiconductor device comprises an insulating substrate, an oxide semiconductor layer, a gate insulating film, a gate electrode, a first insulating film and a second insulating film. The oxide semiconductor layer is provided on the insulating substrate and comprises first and second low-resistance regions and a high-resistance region between the first and second low-resistance regions. The gate insulating film is provided on the high-resistance region of the oxide semiconductor layer. The gate electrode is provided on the gate insulating film. The first insulating film is provided above the gate electrode, gate insulating film and first and second low-resistance regions of the oxide semiconductor layer, and contains at least fluorine. The second insulating film is provided on the first insulating film, and contains aluminum.

Hereafter, Embodiments will now be described with reference to accompanying drawings. In the drawings, the same structural parts are denoted by the same reference symbols.

First Embodiment (Device Structure)

FIG. 1 shows a semiconductor device according to the first embodiment, which is, for example, a top-gate TFT 10.

In the TFT 10, an insulating substrate (to be referred to as a substrate hereinafter) 11 is formed from a material, for example, glass or plastic, but it is not limited to these.

An oxide semiconductor layer 12 is formed on the substrate 11. The oxide semiconductor layer 12 is formed from a transparent oxide semiconductor (TOS) which should preferably contain at least, for example, indium (In) and zinc (Zn), and may further contain gallium (Ga) as a stabilizer, etc.

Specific applicable examples of the oxide semiconductor layer 12 are zinc oxide (ZnO), indium oxide (InO), oxides of binary metals such as In—Zn oxide and In—Ga oxide, and an oxide of ternary metal such as In—Ga—Zn oxide (IGZO). Note that combinations of other metal elements are also applicable as well.

Moreover, the oxide semiconductor layer 12 may be of a single crystal, polycrystal or amorphous of the material. In this embodiment, the oxide semiconductor layer 12 is formed of, for example, amorphous IGZO (a-IGZO).

On the oxide semiconductor layer 12, a gate insulating film 13 and a gate electrode 14 are formed. The gate insulating film 13 is formed from, for example, a silicon oxide film or a silicon nitride film. The gate electrode 14 is formed from, for example, a multilayer of titanium/aluminum/titanium.

When forming the gate insulating film 13 and the gate electrode 14 by etching, the oxide semiconductor layer 12 is over-etched. Thus, oxygen defect (also referred to as an oxygen hole) Vo occurs in the oxide semiconductor layer 12, thereby forming regions of an n+ state. Thus, a source region 12a and a drain region 12b as low-resistance regions are formed in the oxide semiconductor layer 12 in a self-aligned manner with respect to the gate insulating film 13 and the gate electrode 14.

Moreover, the region of the oxide semiconductor layer 12, which is located between the source/drain regions 12a and 12b, is covered by the gate electrode 14 and the gate insulating film 13. Therefore, the oxygen defect Vo does not occur in the region between the source/drain regions 12a and 12b, and therefore a channel region 12c as a high resistance region is formed.

On the substrate 11, an insulating film of a three-layer structure, which includes, for example, first, second and third insulating films 15, 16 and 17 is formed, to cover the gate insulating film 13, gate electrode 14, source region 12a and drain region 12b. The first and third insulating films 15 and 17 are insulating films containing, for example, a metal oxide such as an aluminum oxide (AlOx). The second insulating film 16 is an insulating film which does not contain hydrogen but contains, for example, fluorinated silicon oxide (SiOx:F), fluorinated silicon nitride (SiNx:F) or fluorinated silicon oxynitride (SiON:F).

On the third insulating film 17, a passivation film 18 is formed. The passivation film 18 is formed from, for example, a resin such as polyimide or acrylics.

Contact holes 18a and 18b are made through the passivation film 18, and the first, second and third insulating films 15, 16, and 17 to reach the source region 12a and the drain region 12b, respectively. In the contact holes 18a and 18b, source/drain electrodes 19 and 20 are formed to be in contact with the source/drain regions 12a and 12b, respectively. The source/drain electrodes 19 and 20 are formed from a multilayer film of, for example, titanium/aluminum/titanium.

(Manufacturing Method)

Next, a method of manufacturing the TFT 10 will be described.

Figure 2:
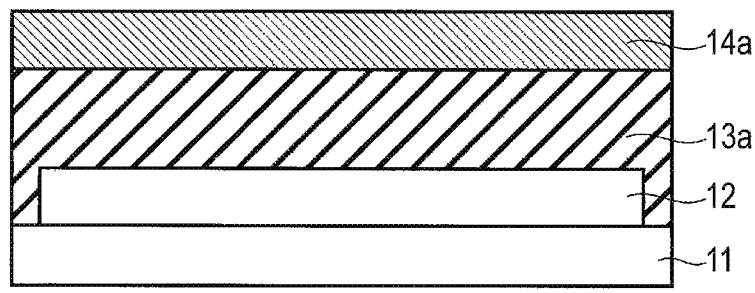
FIG. 2 is a cross-sectional view of a semiconductor device, which illustrates its manufacturing method according to the first embodiment.

As shown in FIG. 2, for example, a-IGZO as the oxide semiconductor layer 12 is formed on the substrate 11 of, for example, glass, by sputtering or the like.

Then, for example, a silicon oxide film ($SiO_2$) 13a and a multilayered film 14a of, for example, titanium/aluminum/titanium as electrode layers are formed sequentially on the oxide semiconductor layer 12.

Figure 3:
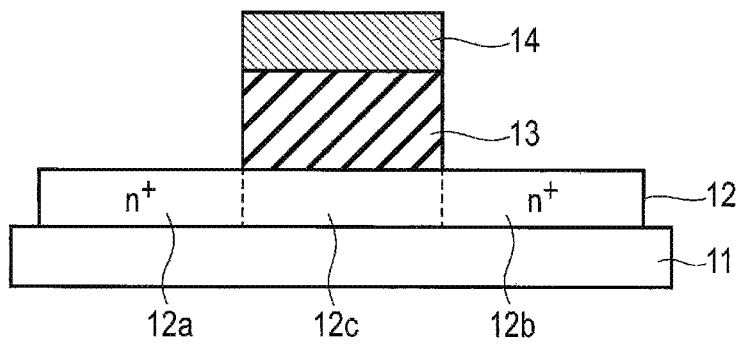
FIG. 3 is a cross-sectional view illustrating a processing step which follows that of FIG. 2.

After that, as shown in FIG. 3, the multilayered film 14a and the silicon oxide film 13a are etched by a dry etching, for example, reactive ion etching (RIE), using a resist layer (not illustrated) as a mask, and thus the gate insulating film 13 and the gate electrode 14 are formed. In this etching process, the surface of the oxide semiconductor layer 12, which is exposed from the gate insulating film 13 and the gate electrode 14 is over-etched, causing the oxygen defect Vo in the oxide semiconductor layer 12, to form n+ state regions. Thus, the source region 12a and the drain region 12b are formed as low-resistance regions in the oxide semiconductor layer 12 in a self-aligned manner with respect to the gate insulating film 13 and the gate electrode 14. The oxide semiconductor layer 12 between the source/drain regions 12a and 12b is covered by the gate insulating film 13 and the gate electrode 14, and therefore the oxygen defect Vo does not occur, and the channel region 12c as a high-resistance region is formed.

Figure 4:
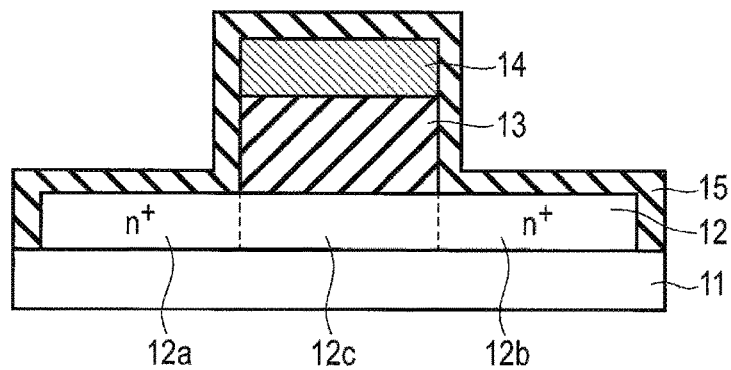
FIG. 4 is a cross-sectional view illustrating a processing step which follows that of FIG. 3.

Subsequently, as shown in FIG. 4, for example, an aluminum oxide (AlOx) film as the first insulating film 15 is formed on an entire surface of the substrate 11, and the oxide semiconductor layer 12, gate insulating film 13 and gate electrode 14 are covered by the first insulating film 15.

More specifically, an aluminum film is formed by, for example, sputtering on the entire surface of the substrate 11, and the thus formed aluminum film is oxidized by heat treatment, thereby forming an aluminum oxide film. The formation of the aluminum oxide film is carried out under such conditions that the temperature of aluminum oxide on the substrate 11 is, for example, 200° C. or less, so as to inhibit the oxygen defect Vo in the source/drain regions 12a and 12b from extending to under the gate electrode.

Figure 5:
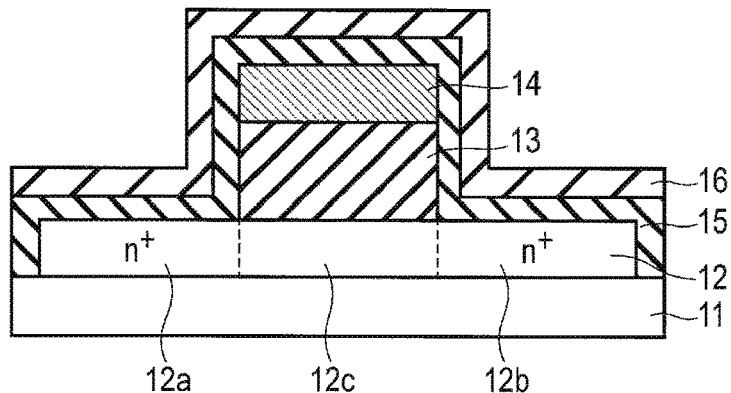
FIG. 5 is a cross-sectional view illustrating a processing step which follows that of FIG. 4.

After that, as shown in FIG. 5, the second insulating film 16 is formed on the first insulating film 15. The second insulating film 16 is formed from, for example, a fluorinated silicon nitride film (SiNx:F). The fluorinated silicon nitride film (SiNx:F) is formed by adding nitrogen to, for example, silicon tetrafluoride ($SiF_4$) as a reactive gas, and supplying the resultant to inductively coupled plasma chemical vapor deposition (ICP-CVD). By using the ICP-CVD, the second insulating film 16 can be formed at a temperature of, for example, 200° C. or less.

Since the second insulating film 16 is formed at a low temperature of 200° C. or less, property of the film is so dense that it contains only a small amount of hydrogen and moisture. Thus, the second insulating film 16 has a barrier effect which prevents the entering of external substances including gaseous materials such as of hydrogen and moisture.

Figure 6:
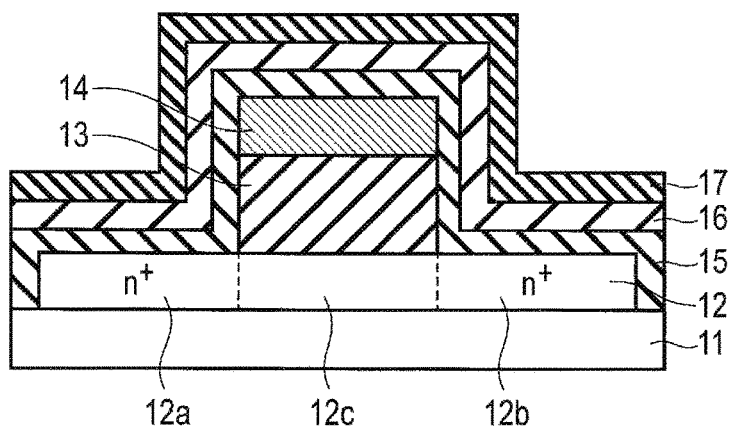
FIG. 6 is a cross-sectional view illustrating a processing step which follows that of FIG. 5.

Subsequently, as shown in FIG. 6, the third insulating film 17 is formed on the second insulating film 16. The material and the manufacturing method for the third insulating film 17 are the same as those of the first insulating film 15.

Thereafter, as shown in FIG. 1, the passivation film 18 is formed from a resin such as polyimide or acrylics on the third insulating film 17. Then, the contact holes 18a and 18b are formed in through the passivation film 18, the third, second and first insulating films 17 and 16 and 15, so as to reach the source/drain regions 12a and 12b, and then in the contact holes 18a and 18b, the source/drain electrodes 19 and 20 formed from a multilayered film of, for example, titanium/aluminum/titanium are formed, respectively.

Effect of First Embodiment

According to the first embodiment described above, the oxide semiconductor layer 12, the gate insulating film 13 and the gate electrode 14 are covered by the first, second and third insulating films 15, 16 and 17, and the second insulating film 16 is formed of SiNx:F, SiOx:F or SiON:F, which does not contain hydrogen. The second insulating film 16 can formed with a heat process involving a lower temperature as compared to the case of a silicon nitride film (SiNx), silicon oxide (SiOx) or silicon oxynitride film (SiON), for which silane ($SiH_4$) is used as source gas. In this manner, it is possible to inhibit oxygen holes produced in the source/drain regions 12a and 12b of the oxide semiconductor layer 12 from being diffused to the channel region 12c by thermal motion. Therefore, the source/drain regions 12a and 12b can be prevented from extending to under the gate electrode 14. As a result, the degradation in the performance of the TFT, which can be caused by an increase in parasitic capacitance can be prevented. Thus, the degradation in the switching characteristics of the TFT 10 can be prevented, making it possible to suppress the leakage current.

Moreover, since the second insulating film 16 can be formed at low temperature as compared to the films formed using silane, it can be formed dense. Therefore, the film can be formed with a very low content of hydrogen and moisture content, making it possible to improve the barrier characteristics against hydrogen and oxygen in the external environment.

Furthermore, the third insulating film 17 of AlOx is formed on the second insulating film 16 of SiNx:F, SiOx:F or SiONx:F, and with this structure, it is possible to further improve the barrier characteristics against hydrogen and oxygen of the external environment.

Second Embodiment (Device Structure)

Figure 7:
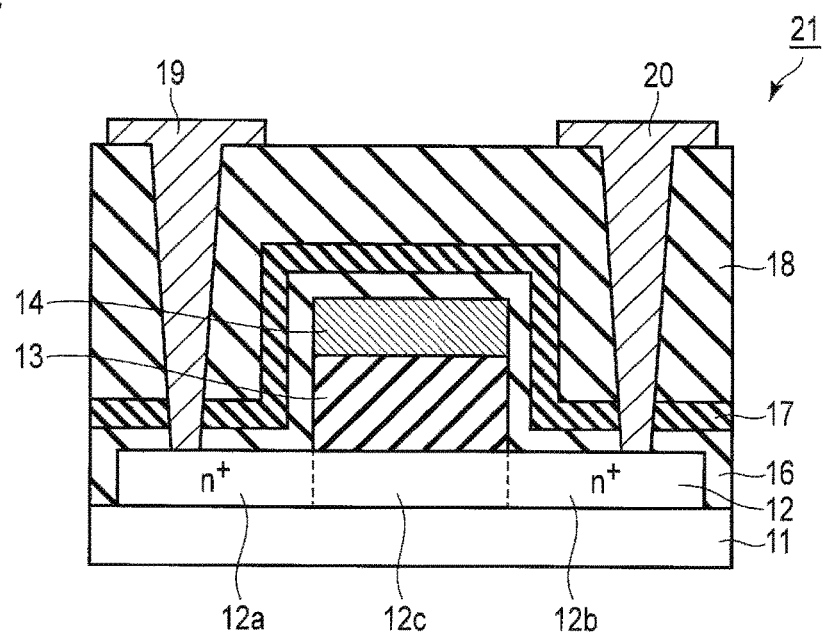
FIG. 7 is a cross-sectional view of a semiconductor device according to the second embodiment.

FIG. 7 shows a semiconductor device according to the second embodiment, which is, for example, a top-gate TFT 21.

In the first embodiment, the oxide semiconductor layer 12, the gate insulating film 13, and the gate electrode 14 are covered by an insulating film of a three-layer structure comprising the first, second and third insulating film 15, 16 and 17. By contrast, in the second embodiment shown in FIG. 7, an oxide semiconductor layer 12, a gate insulating film 13 and a gate electrode 14 are covered by an insulating film of a two-layer structure comprising second and third insulating film 16 and 17 without a first insulating film 15 unlike that of the first embodiment.

In the second embodiment, the second insulating film 16 and the third insulating film 17 are referred to as a first insulating film 16 and a second insulating film 17, respectively.

In the second embodiment, the oxide semiconductor layer 12, the gate insulating film 13 and the gate electrode 14 are directly covered by the first insulating film 16 formed from SiNx:F, SiOx:F or SiONx:F and the first insulating film 16 is brought into contact with source/drain regions 12a and 12b of the oxide semiconductor layer 12. Therefore, fluorine contained in the first insulating film 16 is introduced to the oxide semiconductor layer 12 to terminate dangling bonds produced in the oxide semiconductor layer 12, thereby compensating the oxygen defect Vo. At the same time, oxygen bonded to the metallic element in the oxide semiconductor layer 12 is substituted by fluoride. The fluorine atoms bonded to the metallic elements acts as a donor. In this manner, the dangling bonds are terminated by the fluorine atoms. Thus, even if the oxygen defect Vo in the oxide semiconductor layer 12 is reduced, the source/drain regions 12a and 12b are maintained in the n+ state, that is, a low resistance state.

Further, since the Zn—F bond is more stable than the Zn—O bond, a metallic element bonded to with fluorine is stable as compared to the oxygen defect Vo. Consequently, the metallic elements bonded with fluorine do not easily diffuse in the oxide semiconductor layer 12, thereby suppressing the expansion of the source/drain regions 12a and 12b towards the channel regions 12c.

Furthermore, the first insulating film 16 is covered by the second insulating film 17 formed of AlOx. With this configuration, it is possible to maintain the barrier characteristics against oxygen gas and hydrogen gas of the external environment.

(Manufacturing Method)

In the second embodiment, the manufacturing process up to the formation of the gate electrode 14 is the same as that of the first embodiment. In other words, the manufacturing steps shown in FIG. 2 to FIG. 3 are executed as well in the second embodiment in a manner similar to that of the first embodiment.

Figure 8:
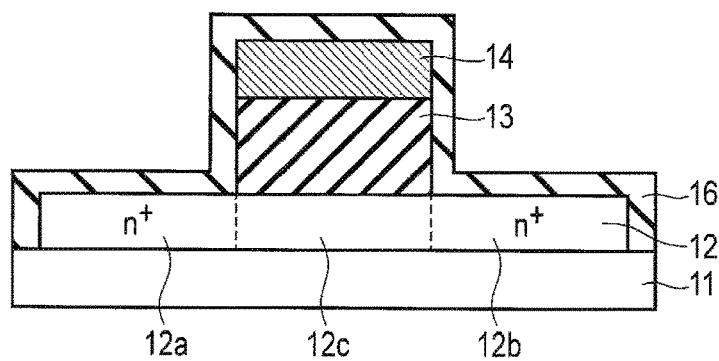
FIG. 8 is a cross-sectional view of a semiconductor device, which illustrates its manufacturing method according to the second embodiment.

As shown in FIG. 8, the gate insulating film 13 and the gate electrode 14 are formed on the oxide semiconductor layer 12, and thereafter the first insulating film 16 is further formed over the substrate 11.

The first insulating film 16 is made from, for example, a fluorinated silicon nitride film (SiNx:F). The fluorinated silicon nitride film (SiNx:F) is formed by adding nitrogen to, for example, silicon tetrafluoride ($SiF_4$) as a reactive gas, and supplying the resultant to ICP-CVD. By using the ICP-CVD, the first insulating film 16 can be formed at a temperature of, for example, 200° C. or less.

While etching the gate electrode 14 and the gate insulating film 13, dangling bonds are produced in the oxide semiconductor layer 12 by over-etching; however these dangling bonds are terminated by the fluorine atoms contained in the fluorinated silicon nitride film (SiNx:F), and thus the oxygen defect Vo is compensated. At the same time, oxygen bonded to the metallic element in the oxide semiconductor layer 12 is substituted by fluorine. The fluorine atoms bonded to the metallic elements acts as a donor, and therefore even if the oxygen defect Vo is reduced, the source/drain regions 12a and 12b of the oxide semiconductor layer 12 are maintained in the n+ state, that is, a low resistance state.

Since the first insulating film 16 is formed at a low temperature of 200° C. or less, property of the film is so dense that it contains only a small amount of hydrogen and moisture. Thus, the first insulating film 16 has a barrier effect which prevents the entering of external substances including gaseous materials such as of hydrogen and moisture.

Figure 9:
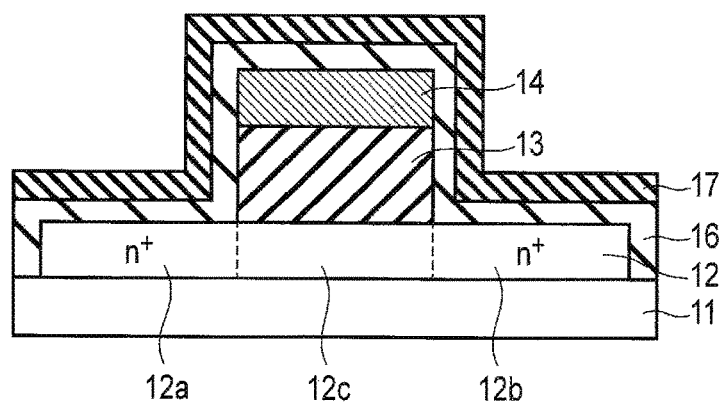
FIG. 9 is a cross-sectional view illustrating a processing step which follows that of FIG. 8.

Subsequently, as shown in FIG. 9, the second insulating film 17 of AlOx is formed on the first insulating film 16. The material and the manufacturing method for the second insulating film 17 are the same as those of the first insulating film 15 discussed in the first embodiment.

Thereafter, as shown in FIG. 7, the passivation film 18 is formed on the second insulating film 17, and contact holes 18a and 18b are formed in through the passivation film 18, the second and first insulating films 17 and 16, and then source/drain electrodes 19 and 20 are formed in the contact holes 18a and 18b, respectively. The Zn—F bond in the oxide semiconductor layer 12 is more stable than the Zn—O bond. Therefore, the extension of the source/drain regions 12a and 12b towards the channel regions 12c, which may occur in a heating process such as of the formation of the passivation film 18, can be suppressed.

Effect of Second Embodiment

According to the second embodiment described above, the gate electrode 14, gate insulating film 13 and oxide semiconductor layer 12 are covered by the fluorine-containing first insulating film 16 such as of SiN:F, SiOx:F, or SiONx:F, and the first insulating film 16 is brought into direct contact with the oxide semiconductor layer 12. With this structure, the fluorine in the first insulating film 16 is introduced to the oxide semiconductor layer 12, and the dangling bonds produced in the oxide semiconductor layer 12 during the etching of the gate electrode 14 and the gate insulating film 13 are terminated, thereby compensating the oxygen defect Vo. At the same time, the oxygen bonded to the metallic elements in the oxide semiconductor layer 12 is substituted by the fluorine. The fluorine bonded to the metallic elements of the oxide semiconductor layer 12 acts as a donor; therefore, even if the oxygen defect Vo in the oxide semiconductor layer 12 is reduced, the source/drain regions 12a and 12b can be maintained in the n+ state.

Further, since the Zn—F bond is more stable than the Zn—O bond, the diffusion thereof, which may occur in the oxide semiconductor layer 12 in a heating process can be suppressed. Therefore, it is possible to prevent the source/drain regions 12a and 12b from being expanded to under the gate electrode 14, thus making it possible to inhibit the degradation in performance of the TFT 10, which may be caused by parasitic capacitance.

Furthermore, the fluorine-containing first insulating film 16 is in contact also with a side surface of the gate insulating film 13. With this structure, dangling bonds produced on the side surface of the gate insulating film 13 can be also terminated. Therefore, the stress on the gate insulating film 13, which may be caused by the voltage applied to the gate electrode, can be relaxed and the operation reliability of the TFT 10 can be improved.

Moreover, the second insulating film 17 of AlOx is formed after covering the gate electrode 14 and the gate insulating film 13 by the fluorine-containing first insulating film 16. The corner portions of the surface of the fluorine-containing first insulating film 16 are curved. With this structure, the coverage of the second insulating film 17 of the formed on the first insulating film 16 can be enhanced. Therefore, it is possible to improve the barrier characteristics of the second insulating film 17 against hydrogen and oxygen of the external environment.

EXAMPLES OF APPLICATION

Figure 10:
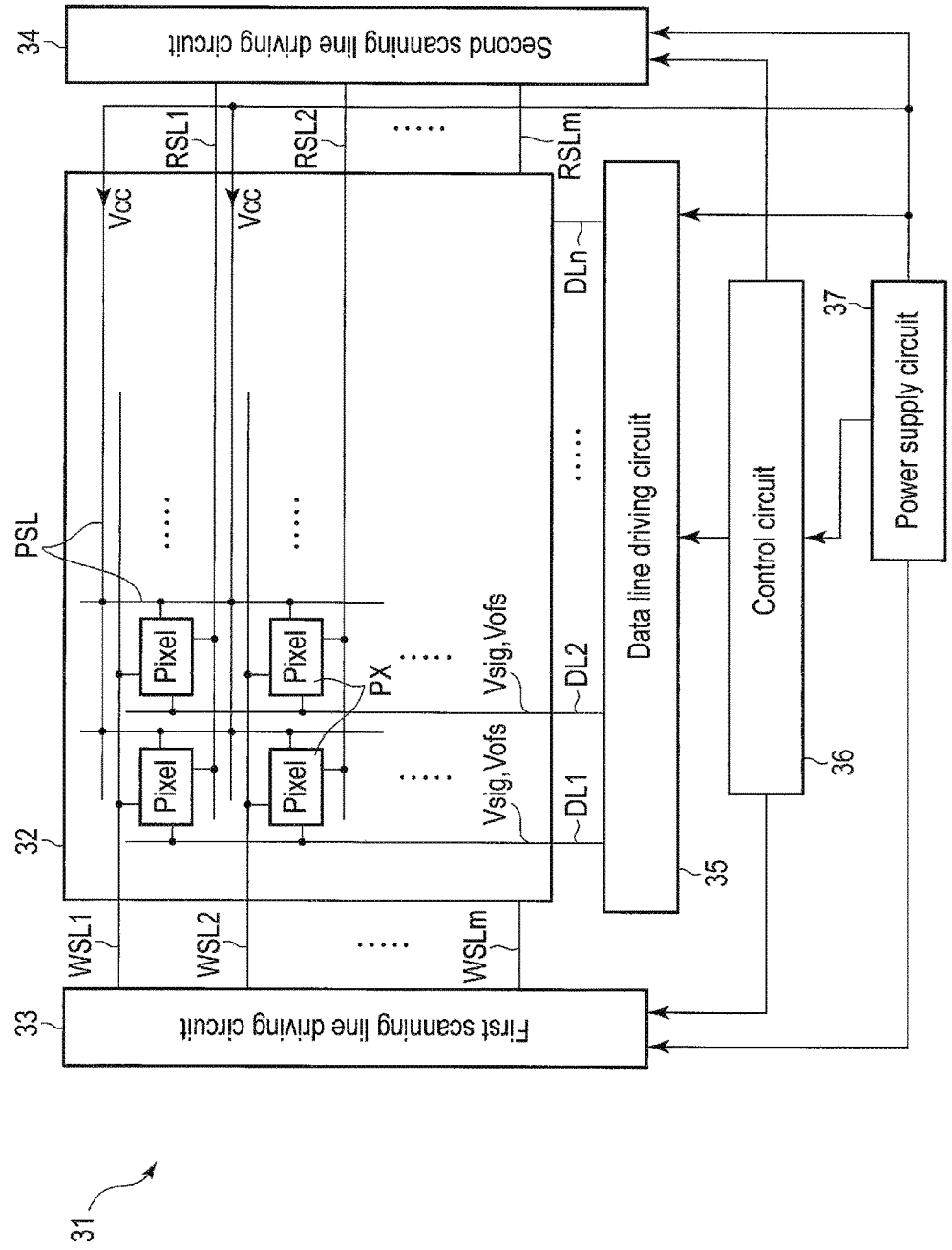
FIG. 10 is a block diagram showing an example of the display device to which the semiconductor device shown in the first or second embodiment is applied.

FIG. 10 shows an example in which the TFT 10 described in the first or second embodiment described above is applied to, for example, an active-matrix organic EL display. The application is not limited to organic EL displays, but the TFT 10 described in the first or second embodiment can be applied also to a active-matrix liquid crystal display.

A active-matrix organic EL display comprises a plurality of pixels each containing, for example, an organic EL device (to be referred to as OELD hereinafter), transistors and the like, and has the structure in which the current flowing the OELD of each pixel is controlled by the transistors and the like.

More specifically, a display device 31 comprises a display unit 32, a first scanning line driving circuit 33, a second scanning line driving circuit 34, a data line driving circuit 35, a control circuit 36 and a power supply circuit 37.

The display unit 32 comprises a plurality of pixels PX. The plurality of pixels PX are arranged in a matrix along row and column directions in the display unit 32. The display unit 32 comprises a plurality of scanning lines WSL1, WSL2 . . . WSLm, for writing, arranged along the row direction, a plurality of scanning lines RSL1, RSL2 . . . RSLm (to be referred to as reset lines hereinafter) for resetting, for example, arranged parallel to the scanning lines WSL1, WSL2 . . . WSLm, respectively, a plurality of data lines DL1, DL2 . . . DLn, arranged along the column direction, and a plurality of power source lines PSL arranged along the row and column directions, to which a power Vcc is supplied.

The pixels PX are respectively arranged at regions where, for example, the scanning lines WSL1, WSL2 . . . WSLm and the reset lines RSL1, RSL2 . . . RSLm, and the data lines DL1, DL2 . . . DLn and the power source line PSL intersect each other. The pixels PX are respectively connected to the scanning lines WSL1, WSL2 . . . WSLm, the data lines DL1, DL2 . . . DLn, the reset line RSL1, RSL2 . . . RSLm and the source line PSL.

When the display device 31 is a color display, a plurality of pixels PX constitute a picture element (pixel) (to be referred to as a color pixel hereinafter) to form one color image. For example, when the color pixel is constituted by red (R), green (G) and blue (B), three pixels PX constitute one color pixel. In this case, R, G and B filters (not shown) corresponding to the three pixels PX are provided.

The first scanning line driving circuit 33, the second scanning line driving circuit 34, the data line driving circuit 35, the control circuit 36 and the power supply circuit 37 are arranged in a periphery of the display unit 32. More specifically, the first scanning line driving circuit 33 and the second scanning line driving circuit 34 are disposed near, for example, both row-directional ends of the display unit 32, respectively, and the data line driving circuit 35, the control circuit 36, and the power supply circuit 37 are arranged near, for example, one column-directional end of the display unit 32.

The scanning lines WSL1, WSL2 . . . WSLm are connected to the first scanning line driving circuit 33 and the reset lines RSL1, RSL2 . . . RSLm are connected to the second scanning line driving circuit 34. The data lines DL1, DL2 . . . DLn are connected to the data line driving circuit 35, and the source line PSL is connected to the power supply circuit 37.

The power supply circuit 37 supplies a power to each of the display unit 32, the first scanning line driving circuit 33, the second scanning line driving circuit 34, the data line driving circuit 35 and the control circuit 36.

The control circuit 36 is connected to the first scanning line driving circuit 33, the second scanning line driving circuit 34 and the data line driving circuit 35, and controls the overall operation of the display device 31 according to video signals and control signals (not shown) supplied from outside.

The first scanning line driving circuit 33 sequentially selects the scanning lines WSL1, WSL2 . . . WSLm under the control of the control circuit 36.

The data line driving circuit 35 outputs, for example, a signal voltage Vsig and a reference voltage Vofs under the control of the control circuit 36 and supplies them to the data lines DL1, DL2 . . . DLn. Here, the signal voltage Vsig is a signal corresponding to brightness information of a video signal, and the reference voltage Vofs is a voltage which is a reference to the signal voltage Vsig of the video signal, that is, for example, a voltage equivalent to the black level of the video signal. The reference voltage Vofs is used also to correct the dispersion in the threshold voltage of the drive transistor which drives the OELD, which will be described later.

The second scanning line driving circuit 34 sequentially selects the reset lines RSL1, RSL2 . . . RSLm under the control of the control circuit 36. More specifically, the second scanning line driving circuit 34 sequentially selects the reset lines RSL1, RSL2 . . . RSLm in synchronism with the operation of the first scanning line driving circuit 33, and controls the light emission and extinction of a plurality of pixels PX connected to one of the scanning lines WSL1, WSL2 . . . WSLm, which is selected by the first scanning line driving circuit 33.

Figure 11:
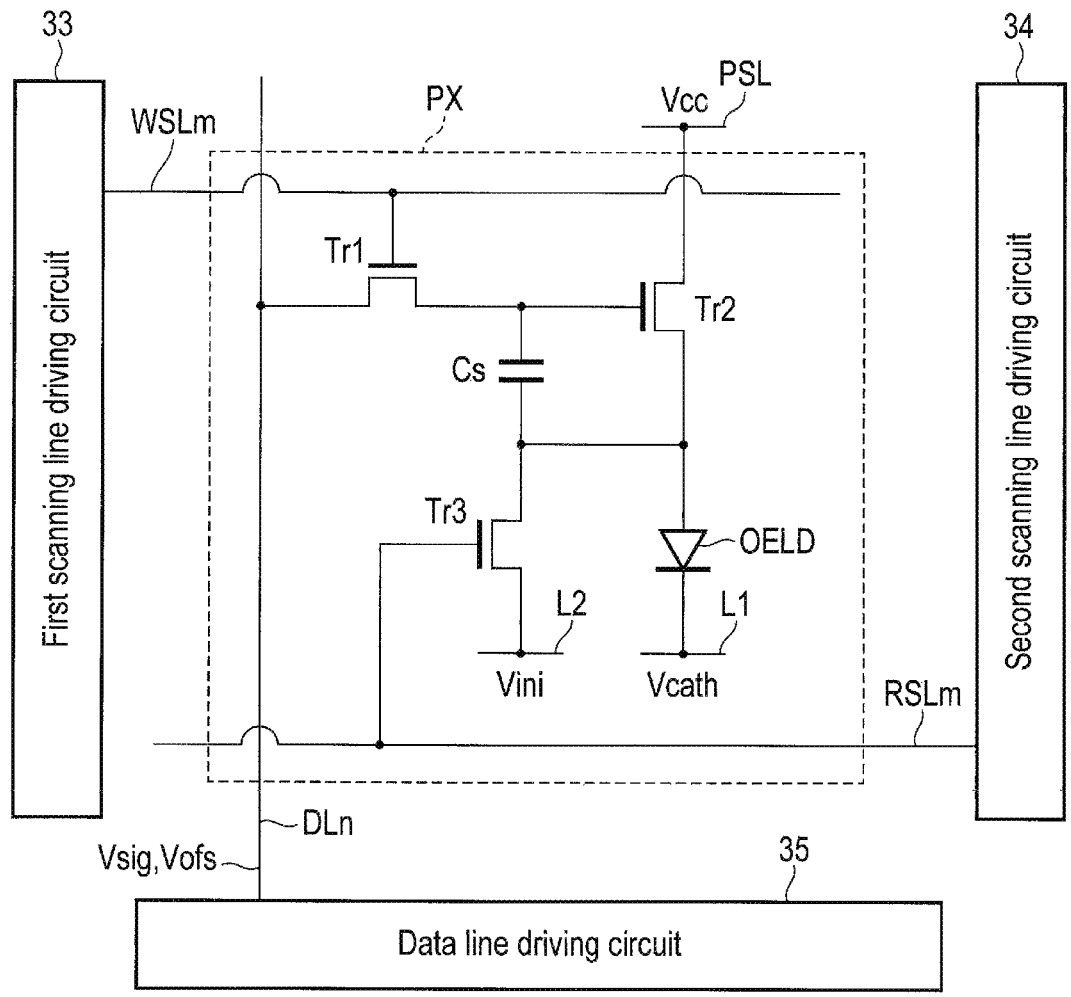
FIG. 11 is a circuit diagram showing an example of the pixel shown in FIG. 10.

FIG. 11 shows an example of a pixel PX shown in FIG. 10.

A pixel PX comprises, for example, a selection transistor Tr1, a drive transistor Tr2, a reset transistor Tr3, an OELD and a capacitor Cs. The selection transistor Tr1, the drive transistor Tr2 and the reset transistor Tr3 are each formed from the top-gate TFT 10 described in the first or second embodiment.

The gate electrode of the selection transistor Tr1 is connected to the scanning line WSLm. One end of the current path (source/drain electrode) of the selection transistor Tr1 is connected to the data line DLn, and the other end is connected to the gate electrode of drive transistor Tr2. One end of the current path of the drive transistor Tr2 is connected to the source line PSL, and the other end is connected to the anode electrode of the OELD. The cathode electrode of the OELD is connected to a wiring line L1 to which a cathode voltage Vcath is supplied.

The first electrode of the capacitor Cs is connected to the gate electrode of the drive transistor Tr2, and the second electrode is connected to the anode electrode of the OELD.

The gate electrode of the reset transistor Tr3 is connected to the reset line RSLm. One end of the current path of the reset transistor Tr3 is connected to the anode electrode of the OELD, and the other end is connected to a wiring line L2, to which the reset voltage Vini is supplied.

Here, when the threshold voltage of the OELD is defined as Vthel, the relationship between the reset voltage Vini, the threshold voltage Vthel of the OELD and the cathode voltage Vcath of the wiring line L1 is expressed by the following formula:

$$Vini < Vthel + Vcath.$$

Thus, the OELD is an extinct state when non-selected.

(Operation of Pixel)

Next, the operation of the pixel PX described above will be schematically described.

The OELD is driven by the current flowing in the drive transistor Tr2. Therefore, when the threshold voltage of the OELD disperses, the intensity of light-emission of the OELD of each pixel varies with respect to the same signal voltage Vsig, thus degrading the image quality. Then, the voltage of the capacitor Cs is corrected by the correction operation using the reference voltage Vofs according to the dispersion in the threshold voltage of the drive transistor Tr2. Here, the details of the correction operation will be omitted.

When the scanning line WSLm is in a selected state (high-level), the selection transistor Tr1 is made conductive, and thus the signal voltage Vsig supplied to the data line DLn is charged on the capacitor Cs. When the drive transistor Tr2 operates in a saturation region so that the charged voltage (Vsig+Vofs) of the capacitor Cs exceeds the threshold voltage of the drive transistor Tr2, the drive transistor Tr2 is made conductive, by which the current corresponding to the charged voltage of the capacitor Cs is supplied to the OELD. The OELD emits light at a brightness according to the current supplied thereto.

Then, the scanning line WSLm is set in a non-selected state (low-level), and while the selection transistor Tr1 is in the non-conductive sate, the reset line RSLm is set in a selected state (high-level). Consequently, the reset transistor Tr3 is made conductive, and the potential of the anode electrode of the OELD is reset to Vini via the reset transistor Tr3. Thus, the light-emission of the OELD is stopped.

Note that the configuration of the pixel PX is not limited to that of FIG. 11 but may be modified.

Moreover, the above-provided descriptions are directed to the case where the top-gate TFT 10 according to the first or second embodiments is applied to a display which employs the organic EL device. But the application of the top gate TFT 10 according to the first or second embodiment is not limited to display devices, but the application to, for example, microprocessors or memories is also possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
an insulating substrate;
an oxide semiconductor layer provided on the insulating substrate, the oxide semiconductor layer including first and second low-resistance regions and a high-resistance region between the first and second low-resistance regions;
a gate insulating film provided on the high-resistance region of the oxide semiconductor layer;
a gate electrode provided on the gate insulating film;
a first insulating film provided above the gate electrode, the gate insulating film and the first and second low-resistance regions of the oxide semiconductor layer, the first insulating film containing at least fluorine;
a second insulating film provided on the first insulating film, the second insulating film comprised of aluminum oxide;
a third insulating film comprising aluminum oxide, wherein the first insulating film is between the second insulating film and the third insulating film; and
a passivation layer over the second insulating film.

2. The device of claim 1, further comprising:
a third insulating film provided between the gate electrode, the gate insulating film, the first and second low-resistance regions of the oxide semiconductor layer, and the first insulating film, the third insulating film containing aluminum.

3. The device of claim 2, wherein
the first insulating film comprises a hydrogen-free insulating film.

4. The device of claim 3, wherein
the first insulating film comprises one of fluorinated silicon oxide (SiOx:F), fluorinated silicon nitride (SiNx:F) and fluorinated silicon oxynitride (SiON:F).

5. A display apparatus including the semiconductor device of claim 1.

6. A display apparatus including the semiconductor device of claim 2.

7. The device of claim 2, wherein the third insulating film directly contacts the first low-resistance region.

8. The device of claim 7, wherein the third insulating film directly contacts a sidewall of the first low-resistance region.

9. The device of claim 2, wherein the second insulating film comprises a same material as the third insulating film.

10. The device of claim 1, wherein the first insulating film is separated from the gate electrode and the gate insulating film.

11. The device of claim 1, further comprising an electrode extending through the first insulating film to electrically connect to the first low-resistance region.

12. The device of claim 1, further comprising a passivation layer over the second insulating film.

13. The device of claim 1, wherein the first insulating film is free of hydrogen.

14. The device of claim 11, wherein the electrode comprises aluminum.

* * * * *